United States Patent
Noh

(10) Patent No.: US 10,553,303 B2
(45) Date of Patent: Feb. 4, 2020

(54) SEMICONDUCTOR DEVICE AND OPERATING METHOD THEREOF

(71) Applicant: SK hynix Inc., Gyeonggi-do (KR)

(72) Inventor: Young-Kyu Noh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 203 days.

(21) Appl. No.: 15/705,975

(22) Filed: Sep. 15, 2017

(65) Prior Publication Data

US 2018/0166149 A1 Jun. 14, 2018

(30) Foreign Application Priority Data

Dec. 13, 2016 (KR) .................. 10-2016-0169217

(51) Int. Cl.
*G11C 29/00* (2006.01)
*G11C 29/44* (2006.01)
*G11C 29/38* (2006.01)

(52) U.S. Cl.
CPC .......... *G11C 29/4401* (2013.01); *G11C 29/38* (2013.01)

(58) Field of Classification Search
CPC ....... G11C 29/84; G11C 29/787; G11C 29/04; G11C 29/789; G11C 2029/0401; G11C 29/44; G11C 29/38; G11C 2029/0403; G11C 29/785; G11C 29/806; G11C 2229/763; G11C 29/808; G11C 17/14; G11C 17/16; G11C 17/18

See application file for complete search history.

(56) References Cited

U.S. PATENT DOCUMENTS

| 4,346,459 | A | * | 8/1982 | Sud | ...................... | G11C 29/808 365/200 |
| 2005/0226078 | A1 | * | 10/2005 | Ito | ......................... | G11C 17/16 365/230.03 |
| 2009/0180340 | A1 | * | 7/2009 | Song | .................... | G11C 29/785 365/200 |
| 2011/0267910 | A1 | * | 11/2011 | Song | .................... | G11C 29/785 365/200 |
| 2012/0120737 | A1 | * | 5/2012 | Kim | ...................... | G11C 17/14 365/189.07 |

FOREIGN PATENT DOCUMENTS

| KR | 1020070082815 | 8/2007 |
| KR | 1020120020384 | 3/2012 |

* cited by examiner

*Primary Examiner* — Guerrier Merant
(74) *Attorney, Agent, or Firm* — IP & T Group LLP

(57) ABSTRACT

A semiconductor device includes: a fuse set unit including a plurality of fuse sets, each fuse set including one or more address fuses and an enable fuse; a rupture control unit suitable for controlling the enable fuse of a selected fuse set to be programmed after the address fuses of the selected fuse set is programmed, during a program operation; a cell data verify unit suitable for repeatedly performing a verify and rupture operation on the selected fuse set during the program operation, determining whether read data from the selected fuse set is identical to target data corresponding to a rupture address through a final verify operation, and outputting fail information; and a fuse set control unit suitable for controlling the program operation to be performed on a different fuse set after the program operation on the selected fuse set is terminated, in response to the fail information.

17 Claims, 10 Drawing Sheets

SEMICONDUCTOR DEVICE AND OPERATING METHOD THEREOF

CROSS-REFERENCE TO RELATED APPLICATION

The present application claims priority of Korean Patent Application No. 10-2016-0169217, filed on Dec. 13, 2016, which is incorporated herein by reference in its entirety.

BACKGROUND

1. Field

Exemplary embodiments of the present invention relate to a semiconductor design technology, and more particularly, to a semiconductor device which performs a post package repair operation.

2. Description of the Related Art

A semiconductor memory device such as a dynamic random access memory (DRAM) includes a plurality of memory cells arranged in a matrix form. If one or more memory cells fail, the semiconductor memory device may be treated as being defective because it does not properly operate. The probability that a memory cell may fail increases with increases in the degree of integration and the speed of a semiconductor memory device.

As a result, a manufacturing yield, which indicates a ratio of the number of normal chips to a total number of chips produced, and which determines the production cost of the semiconductor devices, is reduced as the degree of integration and the speed of semiconductor memory devices increases. Accordingly, for improving the manufacturing yield of higher integration, faster semiconductor memory devices, extensive research is carried out for developing efficient schemes for repairing failed cells.

One technology embeds a repair circuit in the semiconductor memory device for replacing a failed cell with a redundant cell. Generally, a repair circuit may include a plurality of redundant memory cells arranged in redundant columns and rows. In operation, a redundancy cell is selected instead of a failed cell.

That is, when a column/row address signal that designates a failed cell is received, a redundancy column/row is selected instead of a column/row of the failed cell in a normal memory bank.

In general, a plurality of fuses that may be cut is provided in order to find out an address that designates a failed cell. The address of the failed cell is programmed by selectively cutting the fuses.

A method for repairing a failed cell in DRAM includes a wafer repair method for repairing a failed cell in a wafer state and a post packaging repair (PPR) method for repairing a failed cell in a packaging state.

The wafer repair method performs a test in the wafer state and then replaces a failed cell with a redundant cell. The post packaging repair method performs a test in the packaging state and then replaces a failed cell with a redundant cell in the packaging state.

During a wafer repair operation, a program operation may be normally performed because a fuse may be used as another fuse although the fuse has failed so as not to be properly cut. In contrast, during a PPR operation, a program operation may not be successfully performed when a fall fuse is to be cut because the PPR operation is performed in the packaging state on the assumption that the fuse has not failed. Accordingly, a semiconductor memory device such as a DRAM may not repair a failed cell with a target redundant cell, but repair the failed cell with another cell corresponding to an unspecified address designated by the fall fuse.

SUMMARY

Various embodiments are directed to a semiconductor device capable of disabling a selected fuse set when the selected fuse set fails during a program operation, and performing a program operation on another fuse set.

In an embodiment, a semiconductor device may include: a fuse set unit including a plurality of fuse sets, each fuse set including one or more address fuses and an enable fuse; a rupture control unit suitable for controlling the enable fuse of a selected fuse set to be programmed after the address fuses of the selected fuse set is programmed, during a program operation; a cell data verify unit suitable for repeatedly performing a verify and rupture operation on the selected fuse set during the program operation, determining whether read data from the selected fuse set is identical to target data corresponding to a rupture address through a final verify operation, and outputting fail information; and a fuse set control unit suitable for controlling the program operation to be performed on a different fuse set after the program operation on the selected fuse set is terminated, in response to the fall information.

Each fuse set of the plurality of fuse sets may be enabled when the corresponding enable fuse is programmed, and may be disabled when the enable fuse is not programmed.

1 Each fuse set of the plurality of fuse sets may be not selected when one or more of the address fuses is programmed but the enable fuse is not programmed during the program operation.

The rupture control unit may include: a rupture address counting unit suitable for generating a counting signal for controlling a bit sequence of the rupture so that the enable fuse is ruptured after the one or more address fuses are sequentially ruptured from an upper address fuse to a lower address fuse; and a rupture address generation unit suitable for outputting an external address as the rupture address in response to the counting signal.

The enable fuse may correspond to a least significant bit (LSB) of the rupture address to be ruptured.

The rupture control unit may control the address fuses and the enable fuse to be sequentially ruptured according to a bit sequence from a most significant bit (MSB) to a least significant bit (LSB) of the rupture address.

The semiconductor device may further include: a command generation unit suitable for generating a verify read signal and a rupture signal for the verify and rupture operation on the address fuses and the enable fuse in response to a rupture command.

The cell data verify unit may include: a signal transfer unit suitable for transferring the verify read signal as a read signal and transferring the rupture signal; and a comparison unit suitable for receiving the read data output from the selected fuse set, comparing the target data corresponding to the rupture address with the read data, and outputting the fail information.

The fuse set control unit may be suitable for transferring a reboot-up signal to the fuse set unit in response to the fall information, and receiving fuse set change information from the fuse set unit.

The fuse set unit may be suitable for: executing a reboot-up operation in response to the reboot-up signal, and executing the program operation on the different fuse set except for the selected fuse set.

The fuse set unit may be suitable for: programming a fuse corresponding to the rupture address in response to the rupture signal, and reading programmed data in response to the read signal to output the read data.

In an embodiment, an operating method of a semiconductor device may include: providing a plurality of fuse sets, each comprising one or more address fuses and an enable fuse; selecting one of the plurality of fuse sets; programming the address fuses of the selected fuse set; programming the enable fuse after the address fuses are programmed, without programming the enable fuse when the programming of the address fuses is not completed.

The operating method may further include: programming a different fuse set except for the selected fuse set when the programming of the address fuses is terminated without programming the enable fuse.

Each fuse set of the plurality of fuse sets may be enabled when the corresponding enable fuse is programmed, and may be disabled when the enable fuse is not programmed.

In the selecting of the one of the plurality of fuse sets, each fuse set of the plurality of fuse sets may be not selected when one or more of the address fuses is programmed but the enable fuse is not programmed.

The operating method may further include: controlling the address fuses and the enable fuse to be sequentially programmed according to a bit sequence from a most significant bit (MSB) to a least significant bit (LSB) of a rupture address.

The programming of the different fuse set may include: repeatedly performing a verify and rupture operation on the selected fuse set during programming of the selected fuse set; determining whether read data from the selected fuse set is identical to target data corresponding to a rupture address through a final verify operation and outputting the fail information; and selecting the different fuse set in response to the fail information after the programming of the selected fuse set is terminated.

The operating method may further include: generating a verify read signal and a rupture signal for the verify and rupture operation on the address fuses and the enable fuse in response to a rupture command.

DETAILED DESCRIPTION

Figure 1:
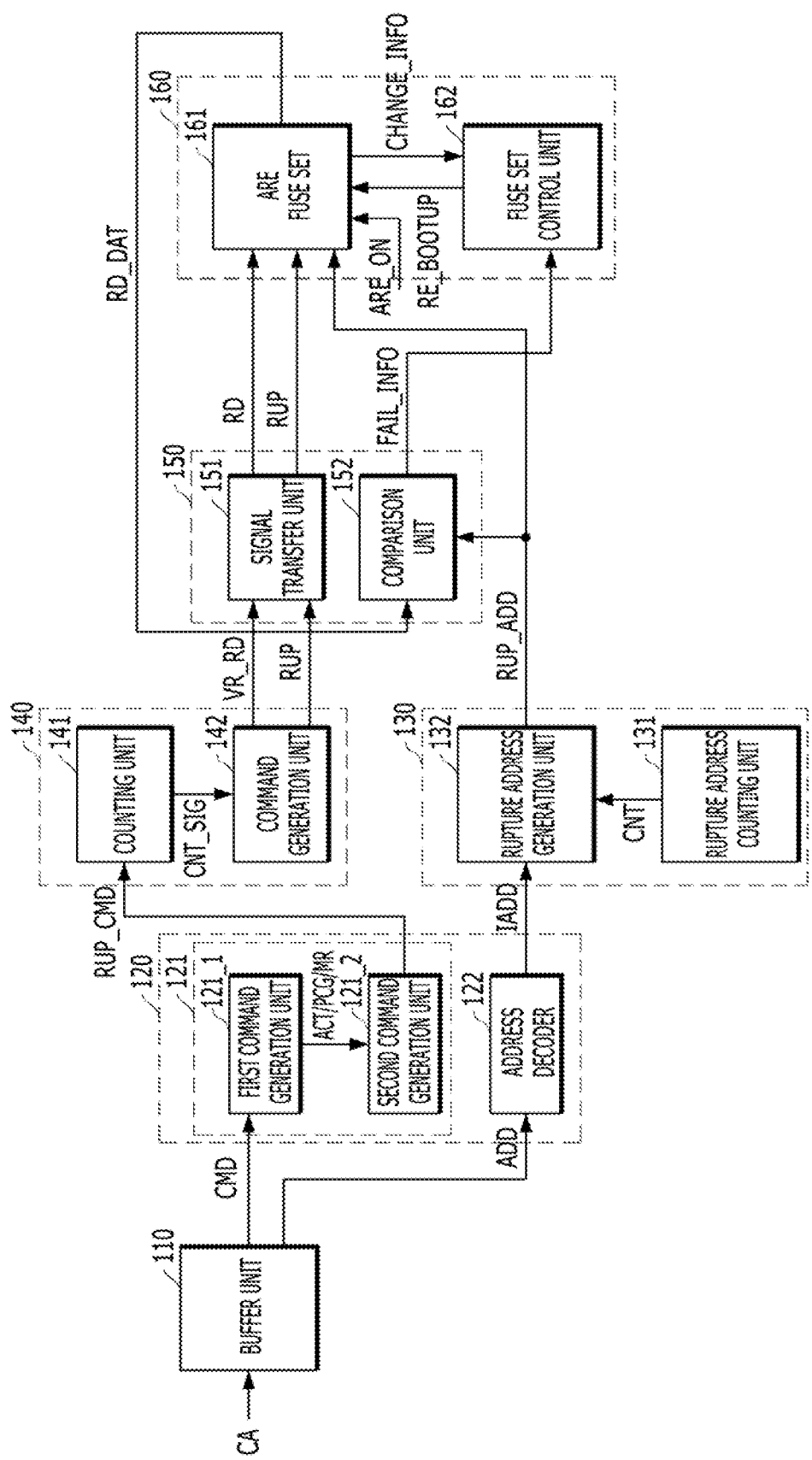
FIG. 1 is a diagram showing a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The terminology used herein is for the purpose of describing particular embodiments only and is not intended to be limiting of the inventive concept. As used herein, singular forms are intended to include the plural forms as well, unless the context clearly indicates otherwise. It will be further understood that the terms "comprises," "comprising," "includes," and/or "including" when used in this specification, indicate the presence of stated features, but do not preclude the presence or addition of one or more other features. As used herein, the term "and/or" indicates any and all combinations of one or more of the associated listed items.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

FIG. 1 is a diagram showing a semiconductor device in accordance with an embodiment of the present invention.

Referring to FIG. 1, the semiconductor device may include a buffer unit 110, a decoding unit 120, a rupture control unit 130, an array E-fuse (ARE) command generation unit 140, a cell data verify unit 150 and an ARE fuse unit 160.

The buffer unit 110 may buffer an external command/address signal CA and output a command CMD and an address ADD. The command/address signal CA may be a signal related to a PPR operation when the PPR operation is performed. The command/address signal CA may be a signal received from an external controller device (not shown).

The decoding unit 120 may include a command decoder 121 and an address decoder 122.

The command decoder 121 may include a first command generation unit 121_1 and a second command generation unit 121_2.

The first command generation unit 121_1 may generate an active command ACT, a mode register signal MR and a precharge command PCG by decoding the command CMD output from the buffer unit 110. The second command generation unit 121_2 may generate a rupture command RUP_CMD in response to the active command ACT, the mode register signal MR and the precharge command PCG generated by the first command generation unit 121_1.

The address decoder 122 may decode the address ADD received from the buffer unit 110 and output an internal address IADD.

The rupture control unit 130 may include a rupture address counting unit 131 and a rupture address generation unit 132.

The rupture address counting unit 131 may include an internal counter and generate a counting signal CNT for controlling a bit sequence of the internal address IADD so as to sequentially rupture an ARE fuse set 161 of the ARE fuse unit 160, according to the bit sequence from an upper address, i.e., a most significant bit (MSB), to a lower address, i.e., a least significant bit (LSB) of the internal address IADD. The rupture address counting unit 131 may control the bit sequence of the internal address IADD so that an enable fuse corresponding to the LSB of the internal address IADD is finally ruptured.

The rupture address generation unit 132 may sequentially output the internal address IADD as a rupture address RUP_ADD in response to the counting signal CNT output from the rupture address counting unit 131.

The ARE command generation unit 140 may generate a verify read signal VR_RD and a rupture signal RUP in response to the rupture command RUP_CMD.

The ARE command generation unit 140 may include a counting unit 141 and a command generation unit 142.

The counting unit 141 may output a counting signal CNT_SIG by performing counting operations corresponding to the bit number of the internal address IADD in response to the rupture command RUP_CMD. The command generation unit 142 may repeatedly output the verify read signal VR_RD and the rupture signal RUP in response to the counting signal CNT_SIG. In this case, the verify read signal VR_RD and the rupture signal RUP may be repeatedly outputted by the predetermined bit number of the internal address IADD in response to the rupture command RUP_CMD. For example, the ARE command generation unit 140 may generate a verify read signal VR_RD and a rupture signal RUP corresponding to a first bit of the internal address IADD and may generate a verify read signal VR_RD and a rupture signal RUP corresponding to a second bit of the internal address IADD. In this case, the verify read signal VR_RD may be a signal for performing an operation for checking whether required data has been written. The rupture signal RUP may be a signal for performing a program operation for rupturing the ARE fuse set 161 of the ARE fuse unit 160. Since the counting unit 141 has information on the predetermined bit number of the internal address IADD from the rupture command RUP_CMD, the counting unit 141 does not need to receive the internal address IADD separately.

The cell data verify unit 150 may include a signal transfer unit 151 and a comparison unit 152.

The signal transfer unit 151 may transfer the verify read signal VR_RD to the ARE fuse set 161 as a read signal RD and may transfer the rupture signal RUP to the ARE fuse set 161.

The comparison unit 152 may receive cell read data RD_DAT from the ARE fuse set 161, may compare data to be ruptured (hereinafter, referred to as "target data"), corresponding to the rupture address RUP_ADD output from the rupture address generation unit 132, with the cell read data RD_DAT, and may output fail information FAIL_INFO depending on whether the target data is identical to the cell read data RD_DAT. In other words, the cell data verify unit 150 may determine whether a corresponding fuse set fails or not by performing a verify read operation for comparing the target data corresponding to the rupture address RUP_ADD, with the cell read data RD_DAT. More specifically, when the target data corresponding to the rupture address RUP_ADD is identical to the read data RD_DAT, the comparison unit 152 may determine that the target data corresponding to the rupture address RUP_ADD is normal and may disable the fail information FAIL_INFO. When the target data corresponding to the rupture address RUP_ADD is not identical to the read data RD_DAT, the comparison unit 152 may determine that the target data corresponding to the rupture address RUP_ADD is abnormal and may enable the fail information FAIL_INFO.

The ARE fuse unit 160 may include the ARE fuse set 161 and a fuse set control unit 162. The ARE fuse set 161 may include a plurality of fuse sets, each including one or more address fuses and an enable fuse.

The ARE fuse set 161 may repeatedly perform a verify and rupture operation on one or more address fuses and an enable fuse, according to the bit sequence from an upper address, i.e., a most significant bit (MSB), to a lower address, i.e., a least significant bit (LSB), of the rupture address RUP_ADD, in response to the read signal RD and the rupture signal RUP, when one of a plurality of fuse sets is selected in response to an ARE enable signal ARE_ON. The ARE fuse set 161 may sequentially output the read data RD_DAT which is data of the selected fuse set, through the verify operation in response to the read signal RD.

The fuse set control unit 162 may output a reboot-up signal RE_BOOTUP to the ARE fuse set 161 when the fail information FAIL_INFO input from the cell data verify unit 150 is enabled. In this case, the reboot-up signal RE_BOOTUP may be a signal that instructs a reboot-up operation to be performed because a failed fuse is present in a corresponding fuse set.

Accordingly, the ARE fuse set 161 may receive the reboot-up signal RE_BOOTUP, may stop a program operation on a failed fuse set, may replace the failed fuse set with another fuse set, may perform a program operation on another fuse set, and may output change information CHANGE_INFO, that is, information about the failed fuse set, to the fuse set control unit 162.

The fuse set control unit 162 includes information about the failed fuse set when performing a subsequent program operation based on the change information CHANGE_INFO. Accordingly, the fuse set control unit 162 may control the ARE fuse set 161 to perform a program operation on other fuse sets except for the failed fuse set.

An operation of the semiconductor device configured as described above in accordance with an embodiment of the present invention is described below with reference to FIGS. 2 to 6.

Figure 2:
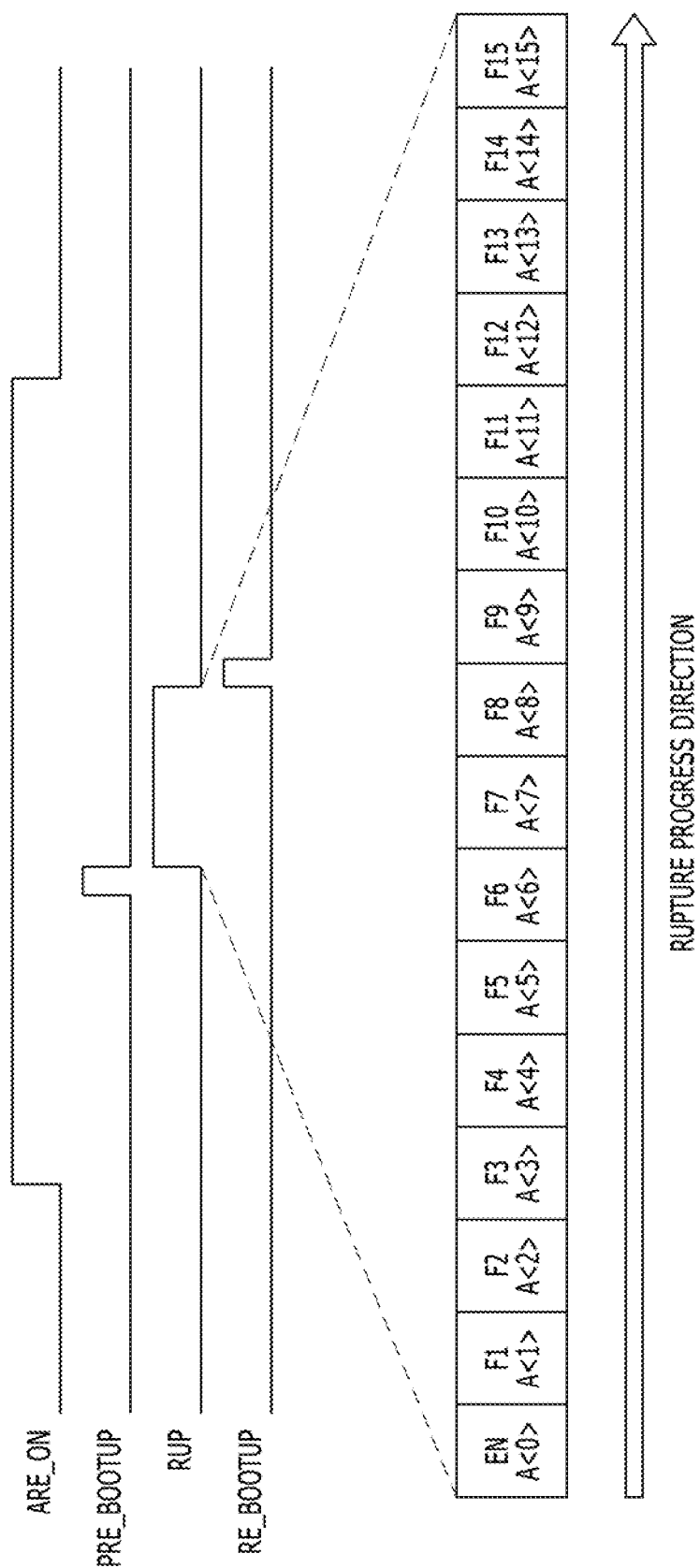
FIG. 2 is a timing diagram showing a program operation of a semiconductor device according to a comparison example.

FIG. 2 is a timing diagram showing a program operation of a semiconductor device according to a comparison example.

Referring to FIG. 2, the semiconductor device according to the comparison example may perform a boot-up operation when the ARE enable signal ARE_ON is enabled and thus a pre-boot-up signal PRE_BOOTUP is enabled. In this case, the pre-boot-up signal PRE_BOOTUP is a signal which may be output from the fuse set control unit 162 and is not shown in FIG. 1. Subsequently, the semiconductor device may sequentially perform a rupture operation on an enable fuse EN and address fuses F1 to F15, each corresponding to the rupture address A<0:15>, in response to the rupture signal RUP. In this case, the rupture operation may be sequentially performed on the enable fuse EN and on the address fuses F1 to F15, according to the bit sequence from the LSB A<0> to the MSB A<15> of the rupture address A<0:15>.

When the rupture operation on the enable fuse EN and on all of the address fuses F1 to F15 is terminated, the semiconductor device may perform a reboot-up operation in response to the reboot-up signal RE_BOOTUP.

Figure 3A:
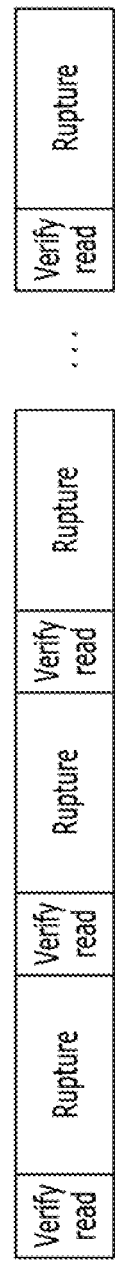
FIGS. 3A to 3C are diagrams showing a state of a selected one of fuse sets when the program operation of FIG. 2 is performed.
Figure 3B:
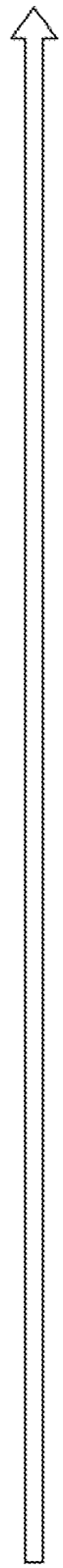
Figure 3C:
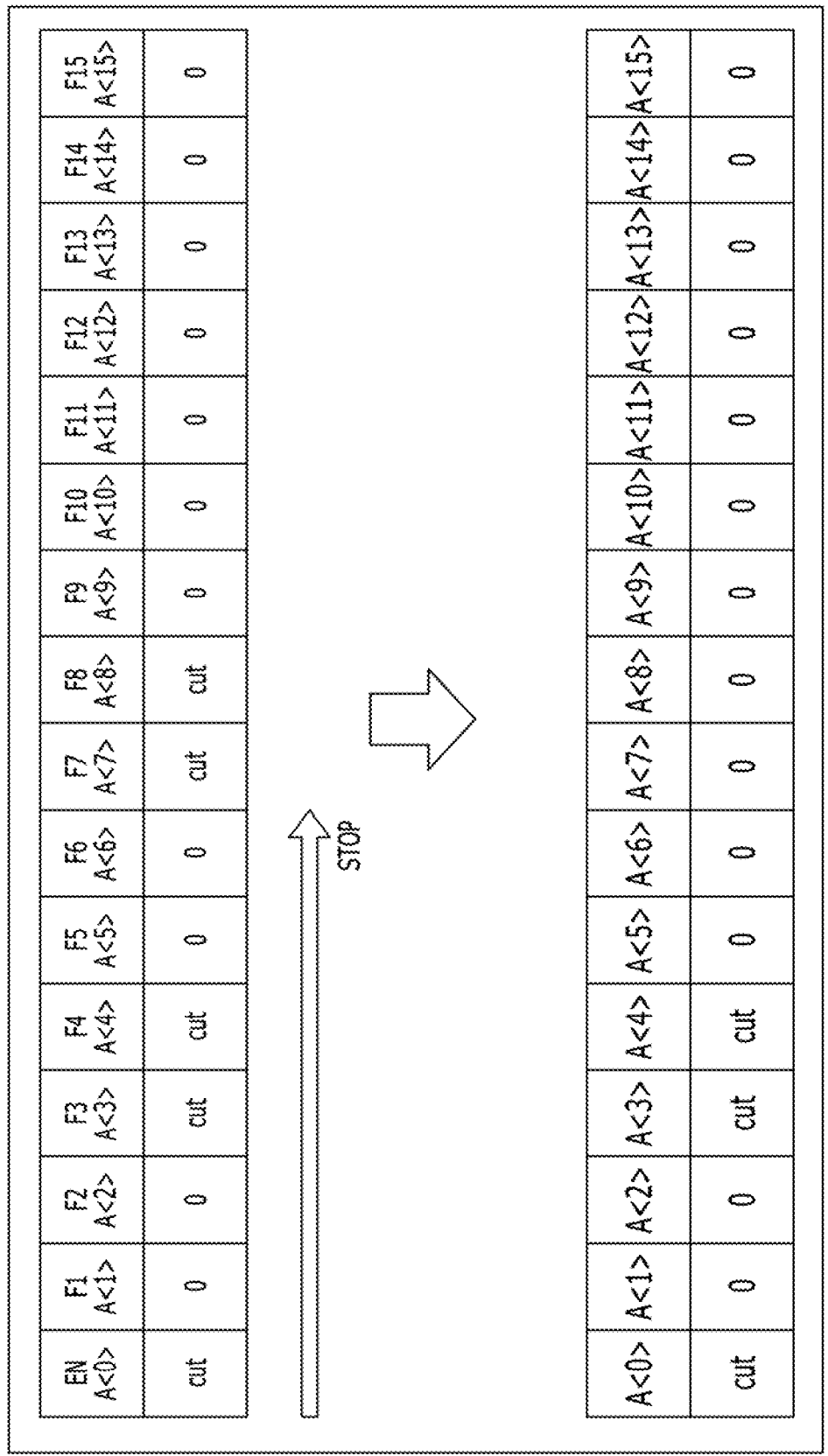

When an operation is performed according to the timing of FIG. 2, the state and operation of a selected fuse set are shown in FIGS. 3A to 3C.

FIGS. 3A to 3C are diagrams showing a state of a selected fuse set when the program operation of FIG. 2 is performed.

FIG. 3A is a diagram showing a program operation of an enable fuse EN and the address fuses F1 to F15, each corresponding to the rupture address A<0:15>. Referring to FIG. 3A, when a verify read operation and a rupture operation are repeatedly performed, a program operation may be performed on the enable fuse EN and each of the address fuses F1 to F15.

FIG. 3B is a diagram showing a rupture operation in which the enable fuse EN is cut to inform that a corresponding fuse set has been selected, and the address fuses F1 to F15 of the selected fuse set are ruptured from the LSB A<1> to the MSB A<15> of the rupture address A<1:15>.

FIG. 3C is a diagram showing a verify read operation after a rupture operation is performed on the selected fuse set, for comparing data corresponding to a rupture address A<0:15> of a fuse set to be ruptured, with data of a programmed fuse set. In this case, the upper side of FIG. 3C shows the data of the programmed fuse set, and the lower side of FIG. 3C shows the data corresponding to the rupture address A<0:15> of the fuse set to be ruptured. Data from the LSB A<0> to the MSB A<15> of the rupture address A<0:15> in the lower side of FIG. 3C may be sequentially compared with the data of the programmed fuse set in the upper side of FIG. 3C. It may be seen that data corresponding to a seventh bit A<7> of the rupture address A<0:15> in the lower side of FIG. 3C is different the data of a seventh address fuse F7 of the programmed fuse set in the upper side of FIG. 3C. In this case, the programmed fuse set may have failed because the seventh address fuse F7 of the programmed fuse set that was first programmed has been cut, but the data corresponding to the seventh bit A<7> of the rupture address A<0:15> of the fuse set to be ruptured has not been cut.

As described above, in the semiconductor device according to the comparison example, when a PPR operation is performed, only a verify read operation and a rupture operation are repeatedly performed, but the final operation may end in a rupture operation. Accordingly, although a target data corresponding to a rupture address and a read data from a programmed fuse set are different, a corresponding fuse set may be classified as a valid fuse set because an enable fuse EN has been cut. Accordingly, a normal operation may not be performed because a corresponding fuse set is used as a valid fuse set although it is a failed fuse set when a next rupture operation is performed.

In accordance with an embodiment of the present invention, in order to address this concern, a semiconductor device in which a rupture sequence of fuse sets is controlled and a verify and read operation is controlled may be configured as in FIG. 1.

Figure 4:
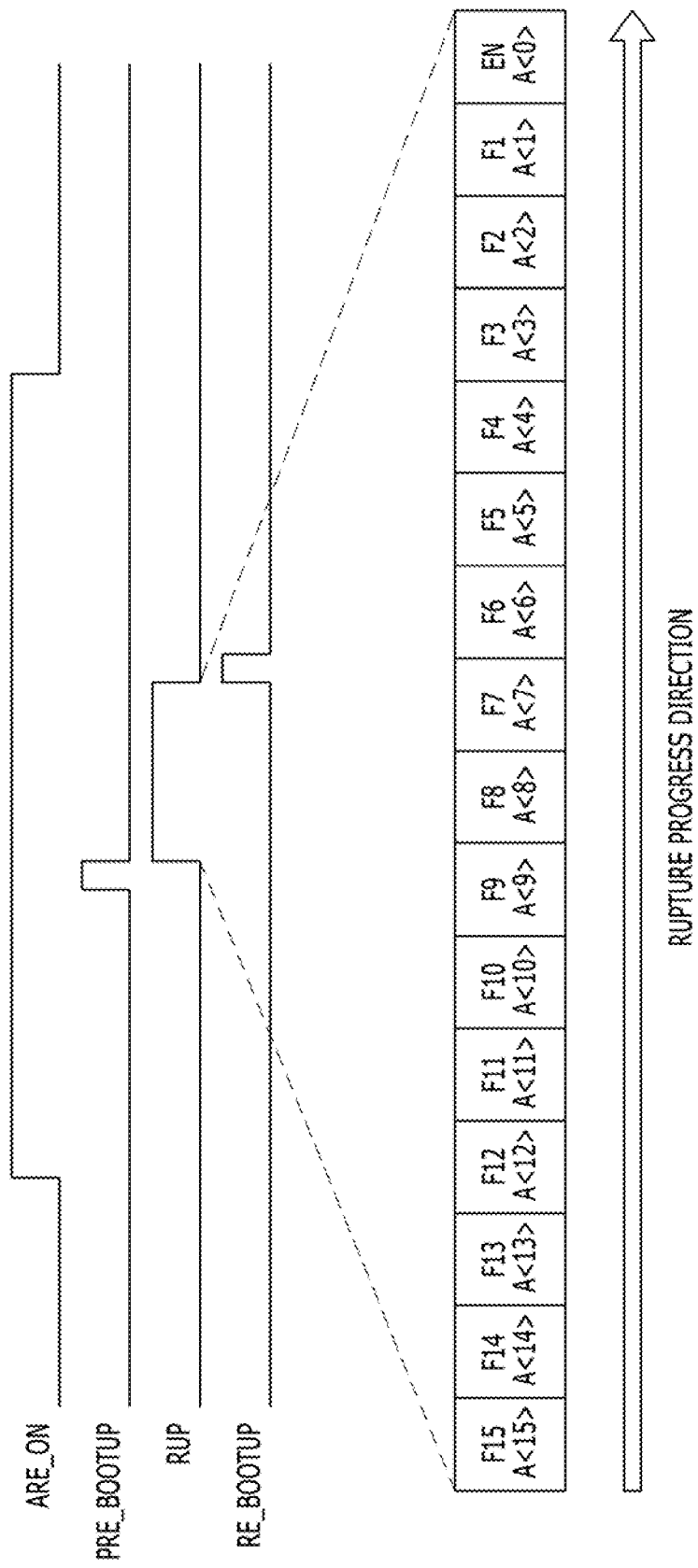
FIG. 4 is a timing diagram showing a program operation of the semiconductor device shown in FIG. 1.

FIG. 4 is a timing diagram showing a program operation of the semiconductor device shown in FIG. 1.

Referring to FIG. 4, in the semiconductor device in accordance with the embodiment of the present invention, when the ARE enable signal ARE_ON is enabled, the pre-boot-up signal PRE_BOOTUP output from the fuse set control unit 162 is enabled and thus the ARE fuse set 161 may perform a boot-up operation.

After the boot-up operation is performed, the ARE fuse set 161 may perform a rupture operation on the enable fuse EN and the address fuses F1 to F15, each corresponding to the rupture address A<0:15>, in response to the rupture signal RUP received from the cell data verify unit 150. At this time, the ARE fuse set 161 may perform the rupture operation on all of the address fuses F1 to F15 and on the enable fuse EN, according to the bit sequence from the MSB A<15> to the LSB A<0> of the rupture address A<0:15>. That is, after performing the rupture operation on all of the address fuses F1 to F15, the ARE fuse set 161 may finally cut the enable fuse EN. Such an operation is made possible by receiving the rupture address RUP_ADD including a controlled rupture sequence through the rupture control unit 130. After the rupture operation on all of the address fuses F1 to F15 corresponding to the rupture address A<1:15> and on the enable fuse EN is terminated, the ARE fuse set 161 may perform a reboot-up operation in response to the reboot-up signal RE_BOOT-UP output from the fuse set control unit 162.

Figure 5A:
FIGS. 5A to 5C are diagrams showing a state of a selected one of fuse sets when the program operation of FIG. 4 is performed.
Figure 5B:
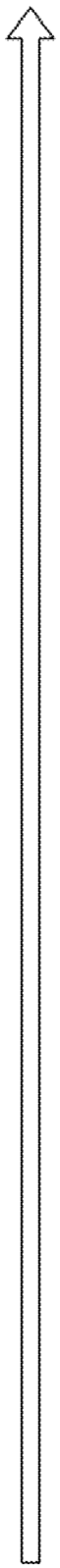
Figure 5C:
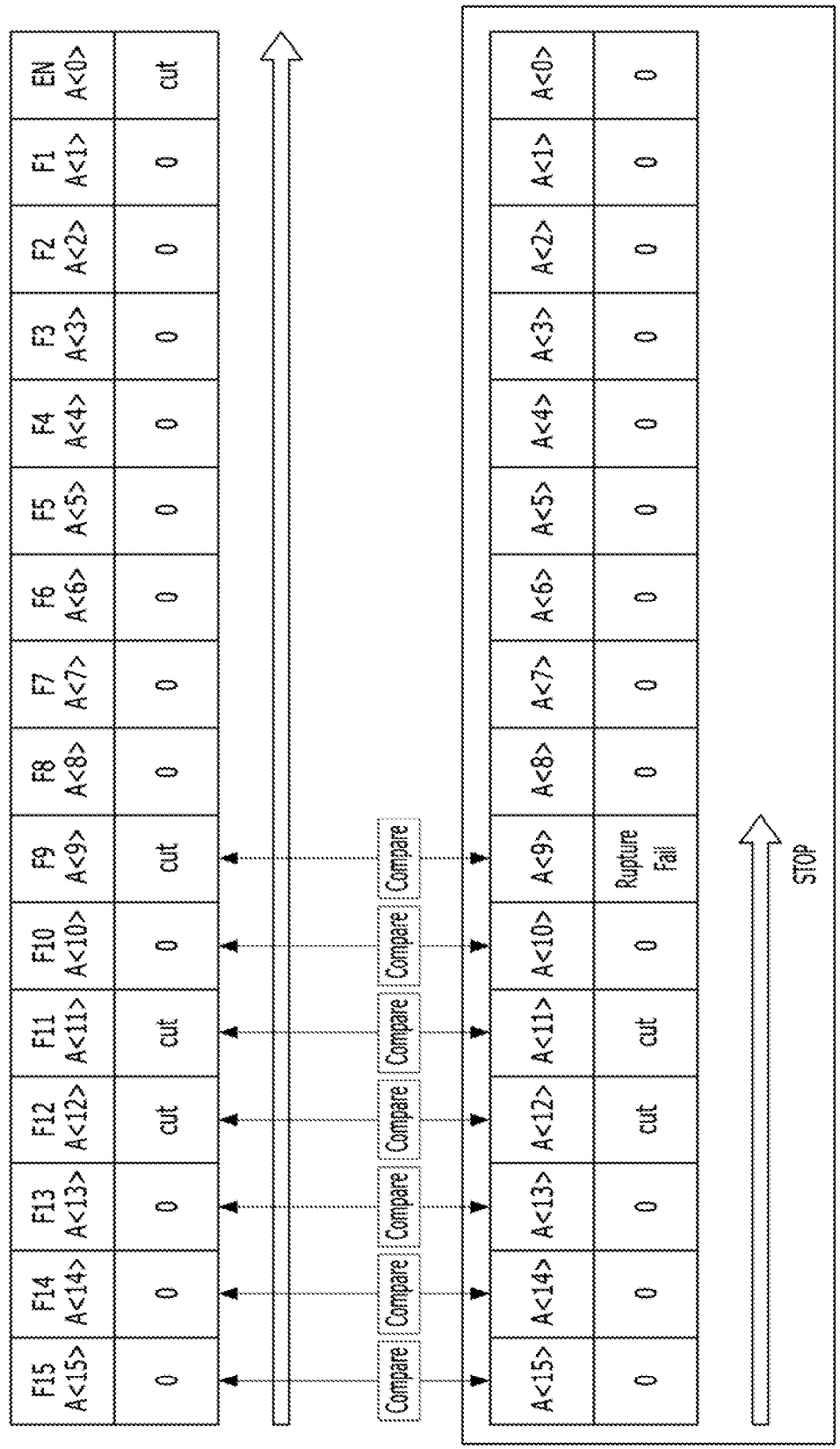

When a program operation of the semiconductor device in accordance with the embodiment of the present invention is performed according to the timing of FIG. 4, the state and program operation of a selected fuse set are shown in FIGS. 5A to 5C.

FIGS. 5A to 5C are diagrams showing a state of a selected one of the fuse sets of the ARE fuse set 161 when a program operation of the semiconductor device shown in FIG. 1 is performed.

FIG. 5A is a diagram showing the program operation sequence of the enable fuse EN and the address fuses F1 to F15, each corresponding to the rupture address A<0:15>. Referring to FIG. 5A, a verify read operation and a rupture operation are repeatedly performed on the enable fuse EN and each of the address fuses F1 to F15, and a verify read operation may be finally performed on the enable fuse EN and the address fuses F1 to F15 once more. Accordingly, the semiconductor device in accordance with the embodiment of the present invention may control a PPR operation to be stopped depending on whether a data read from a programmed fuse set is identical to a target data corresponding to the rupture address due to the verify read operation that is finally performed once more.

FIG. 5B is a diagram showing a rupture operation in which the address fuses F1 to F15 from the MSB A<15> to the LSB address A<1> of the rupture address A<1:15> are ruptured, and the enable fuse EN is finally cut to inform that a corresponding fuse set has been selected.

FIG. 5C is a diagram showing a verify read operation finally performed after a rupture operation is performed on the selected fuse set once more, for comparing data corresponding to a rupture address RUP_ADD to be ruptured, with data of a programmed fuse set. In this case, the upper side of FIG. 5C shows the data of the programmed fuse set, and the lower side of FIG. 5C shows the data corresponding to the rupture address A<0:15> of the fuse set to be ruptured. As the rupture sequence, data corresponding to the MSB A<15> to the LSB A<0> of the rupture address A<0:15> in the lower side of FIG. 5C may be sequentially compared with the data of the programmed fuse set in the upper side of FIG. 5C. From FIG. 5C, it may be seen that a result of the comparison is the same from the MSB A<15> to a tenth bit A<10> of the rupture address A<0:15>, but a result of the comparison for a ninth bit A<9> is different. If the enable fuse EN has been cut, an operation may fail because a corresponding fuse set is used as a valid fuse set. However, the corresponding fuse set may be controlled to be disabled and not used in the future because the enable fuse EN of the corresponding fuse set has not been cut.

If an operation has failed because a data read from a programmed fuse set is not identical to a target data corresponding to a rupture address as described above, a corresponding fuse set is disabled and a rupture operation is performed on another fuse set. This is described below with reference to FIG. 6.

Figure 6:
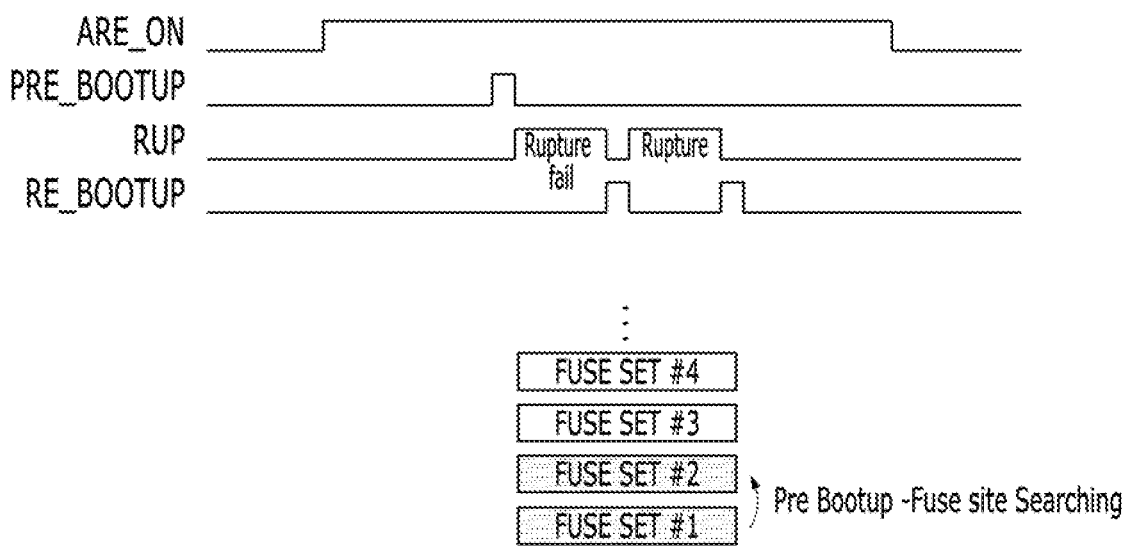
FIG. 6 is a timing diagram showing an example in which a selected fuse set has failed when a program operation of the semiconductor device shown in FIG. 1 is performed.

FIG. 6 is a timing diagram showing an example in which a selected fuse set has failed when a program operation of the semiconductor device shown in FIG. 1 is performed.

Referring to FIG. 6, the semiconductor device in accordance with the embodiment of the present invention may perform a boot-up operation when the ARE enable signal ARE_ON is enabled and the pre-boot-up signal PRE_BOOTUP output from the fuse set control unit 162 is enabled and thus the ARE fuse set 161 may perform a boot-up operation.

After the boot-up operation is performed, a selected fuse set of the ARE fuse set 161, for example, a first fuse set FUSE_SET#1, may perform a rupture operation on an enable fuse and address fuses included therein, corresponding to the rupture address RUP_ADD in response to the rupture signal RUP received from the cell data verify unit 150.

In this case, the first fuse set FUSE_SET#1 may perform the rupture operation on all of the address fuses, and on the enable fuse, according to the bit sequence from the MSB to the LSB of the rupture address RUP_ADD. That is, after performing the rupture operation on all of the address fuses, the first fuse set FUSE_SET#1 may finally cut the enable fuse.

During such a program operation, when the operation fails in the middle of the address fuses as shown in FIG. 5C as a result of a comparison between the target data corresponding to the rupture address RUP_ADD and the cell read data RD_DAT through the final verify read operation, the cell data verify unit 150 may transfer the fail information FAIL_INFO to the fuse set control unit 162. In response to the fail information FAIL_INFO, the fuse set control unit 162 may transfer the reboot-up signal RE_BOOTUP to the ARE fuse set 161.

Accordingly, the ARE fuse set 161 may determine that the first fuse set FUSE_SET#1 corresponding to a currently inputted address is a failed fuse set while performing a reboot-up operation in response to the reboot-up signal RE_BOOTUP, and may transfer the change information CHANGE_INFO indicating that the first fuse set FUSE_SET#1 is replaced with another fuse set, for example, a second fuse set FUSE_SET#2, to the fuse set control unit 162. Accordingly, the ARE fuse set 161 can normally perform the program operation.

In other words, the semiconductor device in accordance with an embodiment of the present invention can determine whether a selected fuse set fails or not by finally performing a verify read operation once more without repeatedly performing only a verify read operation and a rupture operation in performing a PPR operation. A failed fuse set as described above is controlled so that the enable fuse is finally cut. Accordingly, if a failed address fuse is detected before the enable fuse is cut, a corresponding fuse set is determined to have failed and is disabled. As a result, a PPR operation can be normally performed because the PPR operation on the failed fuse set is stopped, and is performed on a replaced fuse set.

Accordingly, the semiconductor device in accordance with an embodiment of the present invention can reduce a probability that an operation is performed erroneously due to a failed fuse set when performing a PPR operation.

According to an embodiment of the present invention, a semiconductor device is provided which can control an enable fuse of a selected fuse set to be finally programmed when performing a PPR operation, and a verify operation is finally performed. Accordingly, a failure of an operation due to a failed cell can be reduced because a corresponding fuse set is disabled when a failed address fuse is detected in the middle.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a fuse set unit comprising a plurality of fuse sets, each fuse set comprising one or more address fuses and an enable fuse corresponding to a plurality of bits of a rupture address, wherein the enable fuse corresponds to a least significant bit (LSB) of the rupture address to be programmed to inform whether the fuse set is selected;
   a rupture control unit suitable for controlling the enable fuse of the selected fuse set to be programmed after the address fuses of the selected fuse set is programmed, during a program operation;
   a cell data verify unit suitable for repeatedly performing a verify and rupture operation on the selected fuse set during the program operation, determining whether read data from the selected fuse set is identical to target data corresponding the a rupture address through a final verify operation, and outputting fail information; and
   a fuse set control unit suitable for controlling the program operation to be performed on a different fuse set after the program operation on the selected fuse set is terminated, in response to the fail information.

2. The semiconductor device of claim 1, wherein each fuse set of the plurality of fuse sets is enabled when the corresponding enable fuse is programmed, and is disabled when the enable fuse is not programmed.

3. The semiconductor device of claim 1, wherein each fuse set of the plurality of fuse sets is not selected when one or more of the address fuses is programmed but the enable fuse is not programmed during the program operation.

4. The semiconductor device of claim 1, wherein the rupture control unit comprises:
   a rupture address counting unit suitable for generating a counting signal for controlling a bit sequence of the rupture so that the enable fuse is ruptured after the one or more address fuses are sequentially ruptured from an upper address fuse to a lower address fuse; and
   a rupture address generation unit suitable for outputting an external address as the rupture address in response to the counting signal.

5. The semiconductor device of claim 1, wherein the rupture control unit controls the address fuses and the enable fuse to be sequentially ruptured according to a bit sequence from a most significant bit (MSB) to the least significant bit (LSB) of the rupture address.

6. The semiconductor device of claim 1, further comprising:
   a command generation unit suitable for generating a verify read signal and a rupture signal for the verify and rupture operation on the address fuses and the enable fuse in response to a rupture command.

7. The semiconductor device of claim 6, wherein the cell data verify unit comprises:
   a signal transfer unit suitable for transferring the verify read signal as a read signal and transferring the rupture signal; and
   a comparison unit suitable for receiving the read data output from the selected fuse set, comparing the target data corresponding to the rupture address with the read data, and outputting the fail information.

8. The semiconductor device of claim 7, wherein the fuse set control unit is suitable for transferring a reboot-up signal to the fuse set unit in response to the fail information, and receiving fuse set change information from the fuse set unit.

9. The semiconductor device of claim 8, wherein the fuse set unit is suitable for:
   executing a reboot-up operation in response to the reboot-up signal, and
   executing the program operation on the different fuse set except for the selected fuse set.

10. The semiconductor device of claim 7, wherein the fuse set unit is suitable for:
   programming a fuse corresponding to the rupture address in response to the rupture signal, and
   reading programmed data in response to the read signal to output the read data.

11. An operating method of a semiconductor device, the operating method comprising:
   providing a plurality of fuse sets, each comprising one or more address fuses and an enable fuse corresponding to a plurality of bits of a rupture address, wherein the enable fuse corresponds to a least significant bit (LSB) of the rupture address to be programmed to inform whether the fuse set is selected;
   selecting one of the plurality of fuse sets;
   programming the address fuses of the selected fuse set;
   programming the enable fuse after the address fuses are programmed, without programming the enable fuse when the programming of the address fuses is not completed.

12. The operating method of claim 11, further comprising:
   programming a different fuse set except for the selected fuse set when the programming of the address fuses is terminated without programming the enable fuse.

13. The operating method of claim 11, wherein each fuse set of the plurality of fuse sets is enabled when the corresponding enable fuse is programmed, and is disabled when the enable fuse is not programmed.

14. The operating method of claim 11, wherein, in the selecting of the one of the plurality of fuse sets, each fuse set of the plurality of fuse sets is not selected when one or more of the address fuses is programmed but the enable fuse is not programmed.

15. The operating method of claim 11, further comprising:
   controlling the address fuses and the enable fuse to be sequentially programmed according to a bit sequence from a most significant bit (MSB) to the least significant bit (LSB) of the rupture address.

16. The operating method of claim 12, wherein the programming of the different fuse set comprises:
   repeatedly performing a verify and rupture operation on the selected fuse set during programming of the selected fuse set;
   determining whether read data from the selected fuse set is identical to target data corresponding to the rupture address through a final verify operation and outputting the fail information; and
   selecting the different fuse set in response to the fail information after the programming of the selected fuse set is terminated.

17. The operating method of claim 16, further comprising:
   generating a verify read signal and a rupture signal for the verify and rupture operation on the address fuses and the enable fuse in response to a rupture command.

* * * * *